(12) United States Patent
Zhu et al.

(10) Patent No.: US 10,437,512 B2
(45) Date of Patent: Oct. 8, 2019

(54) TECHNIQUES FOR NON-VOLATILE MEMORY PAGE RETIREMENT

(71) Applicant: INTEL CORPORATION, Santa Clara, CA (US)

(72) Inventors: Feng Zhu, San Jose, CA (US); Aliasgar S. Madraswala, Folsom, CA (US); Xin Guo, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 255 days.

(21) Appl. No.: 15/394,261

(22) Filed: Dec. 29, 2016

(65) Prior Publication Data
US 2018/0189154 A1 Jul. 5, 2018

(51) Int. Cl.
G06F 3/06 (2006.01)
G11C 29/00 (2006.01)
G11C 7/14 (2006.01)
G11C 29/52 (2006.01)

(52) U.S. Cl.
CPC .......... G06F 3/0659 (2013.01); G06F 3/0619 (2013.01); G11C 29/00 (2013.01); G11C 7/14 (2013.01); G11C 29/52 (2013.01)

(58) Field of Classification Search
None
See application file for complete search history.

(56) References Cited

U.S. PATENT DOCUMENTS

| | | | |
|---|---|---|---|
| 2003/0053334 A1* | 3/2003 | Chen | G11C 11/56 365/185.03 |
| 2012/0240012 A1* | 9/2012 | Weathers | G06F 11/1072 714/773 |
| 2014/0059406 A1* | 2/2014 | Hyun | G11C 11/5621 714/773 |

* cited by examiner

Primary Examiner — J. H. Hur

(57) ABSTRACT

Examples herein include techniques for flash page retirement following one or more defects in nonvolatile memory. In some examples, a storage controller may retire a first logical page in response to a first read error, and write data to the one or more NVM devices in a program-erase (P/E) cycle without a dummy page being programmed or generated for the retired first logical page. The storage controller may further retire a second logical page in response to a second read error, wherein the first logical page has a higher order than the second logical page in a same physical memory page.

20 Claims, 9 Drawing Sheets

700

```
┌─────────────────────────────────────────────────────────┐
│  RECEIVE, AT A CONTROLLER FOR ONE OR MORE NON-VOLATILE  │
│         MEMORY (NMV) DEVICES, A READ REQUEST            │
│                          702                            │
└─────────────────────────────────────────────────────────┘
                             │
┌─────────────────────────────────────────────────────────┐
│   RETIRE A FIRST LOGICAL PAGE OF A PHYSICAL MEMORY      │
│         PAGE IN RESPONSE TO A FIRST READ ERROR          │
│                          704                            │
└─────────────────────────────────────────────────────────┘
                             │
┌─────────────────────────────────────────────────────────┐
│   SKIP PROGRAMMING OF DUMMY PAGE FOR THE RETIRED FIRST  │
│                     LOGICAL PAGE                        │
│                          706                            │
└─────────────────────────────────────────────────────────┘
                             │
┌─────────────────────────────────────────────────────────┐
│  RETIRE A SECOND LOGICAL PAGE FOR THE SAME PHYSICAL     │
│      MEMORY PAGE IN RESPONSE TO A SECOND READ ERROR     │
│                          708                            │
└─────────────────────────────────────────────────────────┘
                             │
┌─────────────────────────────────────────────────────────┐
│  SKIP PROGRAMMING OF DUMMY PAGE FOR THE RETIRED SECOND  │
│                     LOGICAL PAGE                        │
│                          710                            │
└─────────────────────────────────────────────────────────┘
                             │
┌─────────────────────────────────────────────────────────┐
│   RETIRE A THIRD LOGICAL PAGE FOR THE SAME PHYSICAL     │
│      MEMORY PAGE IN RESPONSE TO A THIRD READ ERROR      │
│                          712                            │
└─────────────────────────────────────────────────────────┘
                             │
┌─────────────────────────────────────────────────────────┐
│    PROGRAM DUMMY PAGE FOR THE RETIRED THIRD LOGICAL     │
│                          PAGE                           │
│                          714                            │
└─────────────────────────────────────────────────────────┘
```

*FIG. 7*

Storage Medium 800

Computer Executable
Instructions for 700

FIG. 8

TECHNIQUES FOR NON-VOLATILE MEMORY PAGE RETIREMENT

TECHNICAL FIELD

Examples described herein relate generally to nonvolatile memory technology, and more specifically to systems and methods of managing defects in nonvolatile memory.

BACKGROUND

In some examples, subsets of a NAND flash memory of a solid state device (SSD) exhibiting relatively high bit error rates may be retired, for example, as an error threshold is reached. While some NAND flash memories retire subsets of memory on a block-by-block basis, other NAND flash memories promote greater endurance by supporting retirement of individual physical memory pages of memory. However, employing sub-block granularity for retirement can lead to an undesirable increase in the amount of data that must be maintained, as well an increase in implementation complexity. Thus better memory management schemes are needed for memory products, such as SSD.

BRIEF DESCRIPTION OF THE DRAWINGS

FIG. 7 illustrates an example logic flow.
FIG. 8 illustrates an example of a storage medium.

DETAILED DESCRIPTION

As contemplated in the present disclosure, some storage devices, such as, SSDs may deploy a page retire feature including a NAND defect management scheme with page granularity. The NAND page with read errors may be retired from service without negatively impacting the whole memory block, thus reducing NAND space consumption. In some examples, a page retire sequence may be run from highest to lowest order, while programming of a dummy page with dummy data for one or more of the retired pages is skipped. Such a page retire sequence can be implemented to avoid NAND bandwidth consumption and improve the endurance of the remaining defect-free logical pages in a same wordline following detection of a read error. Furthermore, to avoid boost leakage in a NAND array, the lowest order page can be programmed and its dummy page executed. This page retire sequence avoids excessive NAND bandwidth consumption, as the read margin of the lowest order page is greater than that of the higher order pages, thus fewer order pages are retired.

As further contemplated, the retired pages may be programmed with dummy data in future program-erase (P/E) cycles because of NAND data integrity requirements and to enable a fast read mode. However, programming of dummy pages from the dummy data causes consumption of the NAND bandwidth, which leads to performance non-uniformity and latency degradation. Furthermore, since the retired page is still programmed, the read margin of remaining good logical pages in the same wordline is not improved. Accordingly, to make a partially programmed wordline compatible with fast read mode, which assumes a fully programmed wordline, the remaining program may be run with shifted program verify voltages to allow the read with fully programmed wordline read levels.

The defect management scheme described herein can be used proactively to retire portions of memory with increased granularity, beneficially focusing the retirement of memory on regions of nonvolatile memory that are known to contain a defect, thus improving endurance of remaining defect-free pages. Furthermore, examples provided herein advantageously avoid NAND bandwidth waste on retired pages by avoiding unnecessary dummy page programming for the retired pages. Still furthermore, examples herein are advantageously compatible with a fast read mode by shifting program verify voltages, as will be described in greater detail below.

Figure 1:
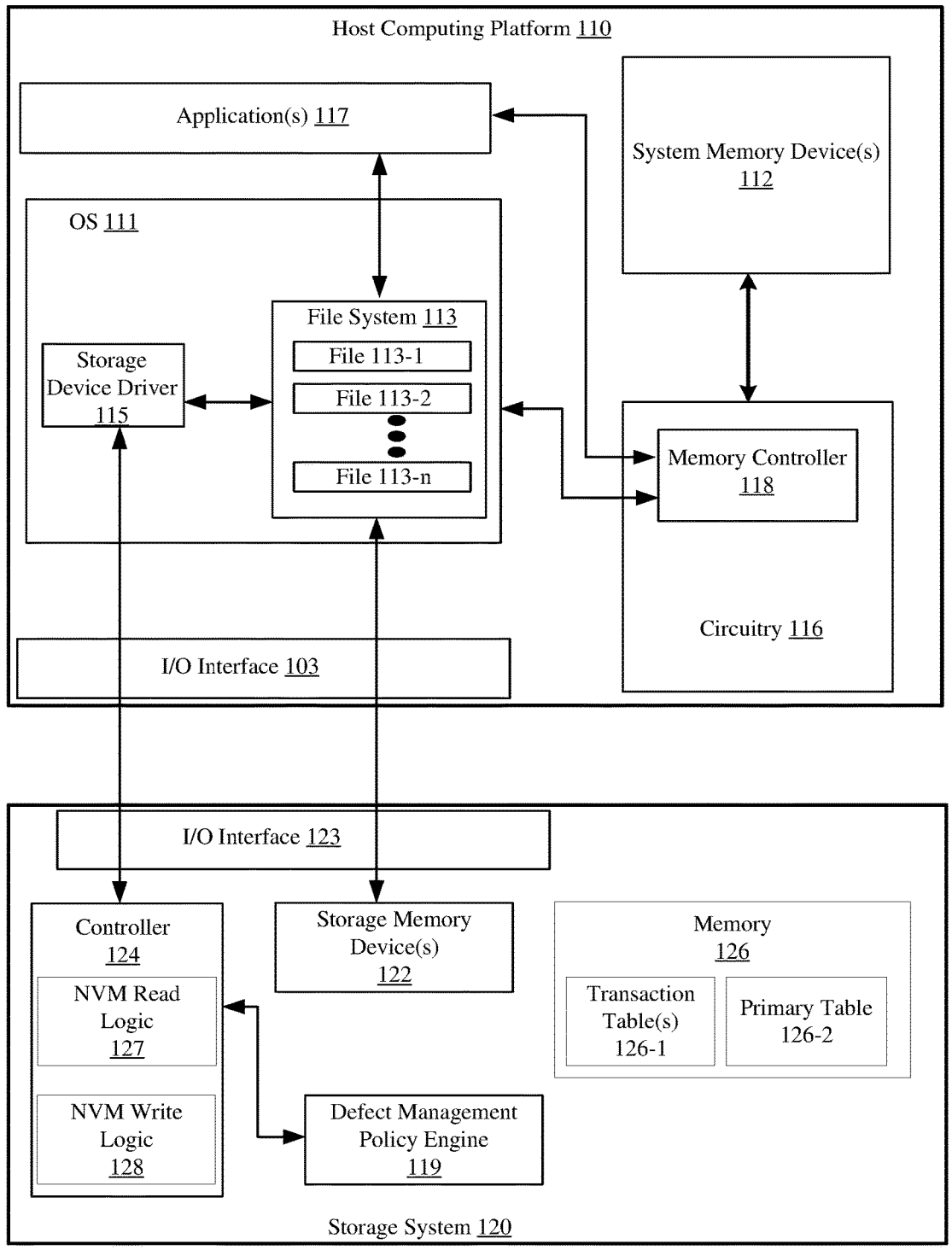
FIG. 1 illustrates an example system.

FIG. 1 illustrates an example system 100. In some examples, as shown in FIG. 1, system 100 includes a host computing platform 110 coupled to a storage system 120 through input/output (I/O) interface 103 and I/O interface 123. Also, as shown in FIG. 1, host computing platform 110 may include an OS 111, one or more system memory device(s) 112, circuitry 116 and one or more application(s) 117. For these examples, circuitry 116 may be capable of executing various functional elements of host computing platform 110 such as OS 111 and application(s) 117 that may be maintained, at least in part, within system memory device(s) 112. Circuitry 116 may include host processing circuitry to include one or more central processing units (CPUs) and associated chipsets and/or controllers.

According to some examples, as shown in FIG. 1, OS 111 may include a file system 113 and a storage device driver 115 and storage system 120 may include a controller 124 and one or more storage memory device(s) 122. OS 111 may be arranged to implement storage device driver 115 to coordinate at least temporary storage of data for a file from among files 113-1 to 113-*n*, where "n" is any whole positive integer >1, to storage memory device(s) 122. The data, for example, may have originated from or may be associated with executing at least portions of application(s) 117 and/or OS 111. As described in more detail below, the OS 111 communicates one or more commands and transactions with storage system 120 to read and write data with storage system 120. The commands and transactions may be organized and processed by logic and/or features at the storage system 120 to deploy a page retire feature including a NAND defect management scheme with page granularity.

According to some examples, the storage system 120 includes a defect management policy engine 119 communicably coupled to the controller 124. As further shown, the controller 124 includes non-volatile memory (NVM) read logic 127 for use in reading data from the storage memory device(s), as well as NVM write logic 128 for use in writing data to the storage memory device(s) 122, for example, in response to one or more data read/write requests issued by the host computing platform 110.

In some examples, the system further includes one or more processors communicatively coupled to the controller 124, a network interface communicatively coupled to the system, a battery coupled to the system, and/or a display communicatively coupled to the system.

In some examples, the controller 124 may include logic and/or features to employ a NAND defect management scheme for storage memory device(s) 122 at storage system 120. According to some examples, logic and/or features of controller 124 may receive a read request, and retire one or more logical pages in response to a read error.

According to some first examples, as described more below, logic and/or feature of controller 124 may retire a first logical page in response to a first read error, and write data to the one or more storage memory device(s) 122 in a first P/E cycle without a dummy page being generated or programmed with dummy data for the retired first logical page. Furthermore, logic and/or features of the controller 124 may retire a second logical page in response to a second read error, wherein the first logical page has a higher order than the second logical page in a same physical memory page. As used herein, higher order logical pages are those logical pages with comparatively less read margin. For example, in the context of the examples described herein, an extra logical page has a higher order and less read margin than an upper logical page of the same physical memory page, while the upper logical page has a higher order and less read margin than a lower logical page of the same physical memory page.

According to some examples, as described more below, logic and/or feature of controller 124 may write data to the one or more storage memory device(s) 122 in a second P/E cycle without a dummy page being generated for the retired second logical page. In other examples, logic and/or feature of controller 124 may write data to the one or more storage memory device(s) 122 in a second P/E cycle after a dummy page is generated for the retired second logical page.

According to some examples, the controller 124 may further retire a third logical page in response to a third read error, and program the third retired page with a dummy page. In some examples, the controller 124 may write data to the one or more storage memory device(s) 122 in a third P/E cycle following programming of a dummy page for the third retired page.

In some examples, memory 126 may include volatile types of memory including, but not limited to, random access memory (RAM), dynamic random access memory (D-RAM), double data rate synchronous dynamic random-access memory (DDR SDRAM), synchronous random-access memory (SRAM), thyristor random-access memory (T-RAM) or zero-capacitor (Z-RAM). A memory subsystem as described herein may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

However, examples are not limited in this manner, and in some instances, memory 126 may include non-volatile types of memory, whose state is determinate even if power is interrupted to memory 126. In some examples, memory 126 may include non-volatile types of memory that may be byte or block addressable. These block addressable or byte addressable non-volatile types of memory for memory 126 may include, but are not limited to, 3-D cross-point memory, memory that use chalcogenide phase change material (e.g., chalcogenide glass), multi-threshold level NAND flash memory, NOR flash memory, single or multi-level phase change memory (PCM), resistive memory, nanowire memory, ferroelectric transistor random access memory (FeTRAM), magnetoresistive random access memory (MRAM) memory that incorporates memristor technology, or spin transfer torque MRAM (STT-MRAM), or a combination of any of the above, or other non-volatile memory types.

In some examples, storage memory device(s) 122 may be a device to store data from write transactions and/or write operations. Storage memory device(s) 122 may include one or more chips or dies having gates that may individually include one or more types of non-volatile memory to include, but not limited to, NAND flash memory, NOR flash memory, 3-D cross-point memory, ferroelectric memory, SONOS memory, ferroelectric polymer memory, FeTRAM, FeRAM, ovonic memory, nanowire, EEPROM, phase change memory, memristors or STT-MRAM. For these examples, storage system 120 may be arranged or configured as a solid-state drive (SSD). The data may be read and written in blocks and a mapping or location information (e.g., L2P indirection tables) for the blocks may be kept in one or more transaction table(s) 126-1 and/or primary table(s) 126-2.

Examples are not limited to storage devices arranged or configured as SSDs; other storage devices such as a hard disk drive (HDD) are contemplated. In these instances, the storage memory device(s) 122 may include one or more platters or rotating disks having a magnet material to store data. The data may be read and written in blocks and a mapping or location information for the blocks may be kept in transaction table(s) 126-1 and/or primary table 126-2.

According to some examples, communications between storage device driver 115 and controller 124 for data stored in storage memory devices(s) 122 and accessed via files 113-1 to 113-$n$ may be routed through I/O interface 103 and I/O interface 123. I/O interfaces 103 and 123 may be arranged as a Serial Advanced Technology Attachment (SATA) interface to couple elements of host computing platform 110 to storage system 120. In another example, I/O interfaces 103 and 123 may be arranged as a Serial Attached Small Computer System Interface (SCSI) (or simply SAS) interface to couple elements of host computing platform 110 to storage system 120. In another example, I/O interfaces 103 and 123 may be arranged as a Peripheral Component Interconnect Express (PCIe) interface to couple elements of host computing platform 110 to storage system 120. In another example, I/O interfaces 103 and 123 may be arranged as a Non-Volatile Memory Express (NVMe) interface to couple elements of host computing platform 110 to storage system 120. For this other example, communication protocols may be utilized to communicate through I/O interfaces 103 and 123 as described in industry standards or specifications (including progenies or variants) such as the Peripheral Component Interconnect (PCI) Express Base Specification, revision 3.1, published in November 2014 ("PCI Express specification" or "PCIe specification") and/or the Non-Volatile Memory Express (NVMe) Specification, revision 1.2, also published in November 2014 ("NVMe specification").

In some examples, system memory device(s) 112 may store information and commands which may be used by circuitry 116 for processing information. Also, as shown in FIG. 1, circuitry 116 may include a memory controller 118. Memory controller 118 may be arranged to control access to data at least temporarily stored at system memory device(s) 112 for eventual storage to storage memory device(s) 122 at storage system 120.

System Memory device(s) 112 may include one or more chips or dies having volatile types of memory such as RAM, D-RAM, DDR SDRAM, SRAM, T-RAM or Z-RAM. However, examples are not limited in this manner, and in some instances, system memory device(s) 112 may include non-volatile types of memory, including, but not limited to, NAND flash memory, NOR flash memory, 3-D cross-point memory, ferroelectric memory, SONOS memory, ferroelectric polymer memory, FeTRAM, FeRAM, ovonic memory, nanowire, EEPROM, phase change memory, memristors or STT-MRAM.

According to some examples, host computing platform 110 may include, but is not limited to, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof.

It is noted that nonvolatile memory (NVM) storage can be organized within the storage memory device(s) 122 in a plurality of blocks of nonvolatile memory. Further, each block can include sixty-four (64) sequentially ordered pages, or any other suitable number of sequentially ordered pages. In addition, each page can include a plurality of NVM storage elements or cells for storing the data, as well as any metadata (e.g., valid/invalid markers, physical/logical addresses, a sequence number) that may have been generated for the page, or the data stored on the page.

The defect management policy engine 119 is operative to monitor a plurality of trigger events for detecting possible defects in one or more of the storage memory device(s) 122 included in the storage system 120, and to apply one or more defect management policies to the storage memory device(s) 122 to retire a physical memory page corresponding to a plurality of logical pages. In one embodiment, such trigger events can include at least three (3) types of trigger events, namely, a hard bit read (HBR) trigger event, a soft bit read (SBR) trigger event, and an XOR data recovery trigger event. Further, each of the HBR trigger event, SBR trigger event, and XOR data recovery trigger event can be generated, from time to time, during the operation of reading data from the storage memory device(s) 122 using the NVM read logic 127. The defect management policies from the defect management policy engine 119 can be used proactively to retire memory in the storage system 120 with increased granularity, focusing the retirement of memory on regions of nonvolatile memory that are known to contain a defect.

Such retirement of memory in the storage system 120 can involve the retirement (i.e., the discontinued use) of at least one block of nonvolatile memory, at least one page within at least one block of nonvolatile memory, at least one NVM storage location within at least one page, or any other suitable region of nonvolatile memory. For example, a physical memory block/page can be retired by relocating its data content to another physical memory block/page or other region of nonvolatile memory, and placing the retired physical memory block/page on one or more lists of blocks/pages that should not be subsequently allocated for storing data. A region of nonvolatile memory can also be retired by remapping an address for that region of nonvolatile memory to correspond to the address for another region of nonvolatile memory. Such lists of retired blocks/pages and/or remapped addresses can be stored in volatile or nonvolatile memory associated with the controller 124, e.g., the memory 126.

Figure 2:
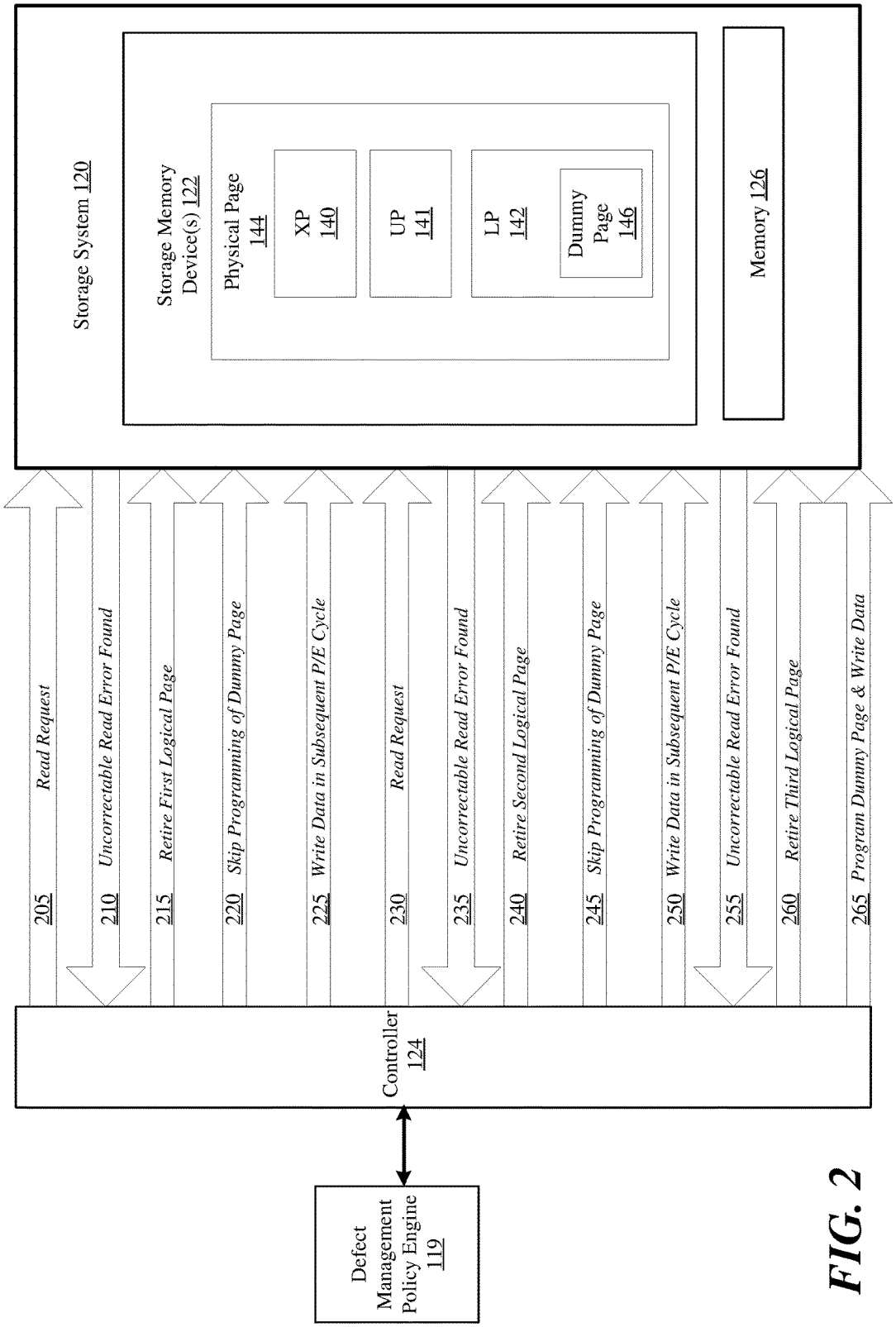
FIG. 2 illustrates an example process.

FIG. 2 illustrates an example process 200. In some examples, process 200 as shown in FIG. 2 depicts a process to retire a physical memory page corresponding to a plurality of logical pages in a wordline. In some examples, process 200 may be implemented by or use components or elements of system 100 shown in FIG. 1 such as application(s) 117, storage system 120, controller 124, memory 126 and/or storage memory device(s) 122. In some examples, the storage memory devices(s) 122 is a triple level cell (TLC) flash NAND with three logical pages for a same physical memory page. In other examples, the storage memory device(s) 122 is a multiple level cell (MLC) flash NAND with two logical pages for a same physical memory page. However, process 200 is not limited to being implemented by or use only these component or elements of system 100.

In some examples, at 205, a read request may be sent or submitted by application(s) 117 via the controller 124, which is operable with the defect management policy engine 119. In the event an uncorrectable read error is found, at 210, the defect management policy engine 119 and the controller 124 may cause, at 215, a first logical page to be retired in response to the uncorrectable read error. In some examples, the first logical page is an extra page (XP) 140 for a physical memory page 144 of a TLC flash NAND. A command to skip programming of a dummy page for the retired first logical page is then sent from controller 124 at 220. In some examples, programming of the dummy page is skipped in future P/E cycles regardless of whether the uncorrectable read error is found in XP 140, or found in an upper page (UP) 141 or a lower page (LP) 142. Data may then be written, at 225, to the storage memory devices(s) 122 in a subsequent P/E cycle without a dummy page being generated for the retired first logical page.

In some examples, at 230, a read request may again be sent or submitted by application(s) 117 via the controller 124 to the storage memory device(s) 122. In the event a second uncorrectable read error is found, at 235, the defect management policy engine 119 may cause, at 240, a second logical page to be retired in response to the second uncorrectable read error. In some examples, the second logical page is the UP 141 or LP 142 for the physical memory page 144. A command to skip or preclude programming of a dummy page for the retired second logical page is then sent from controller 124 at 245. Data may then be written, at 250, to the storage memory devices(s) 122 in a subsequent P/E cycle without a dummy page being generated for the retired second logical page. In other examples, a command to program a dummy page for the retired second logical page may be sent from the controller 124, and data may then be written to the storage memory devices(s) 122 in a subsequent P/E cycle after the dummy page is generated for the retired second logical page.

In the event a third uncorrectable read error is found at 255, the defect management policy engine 119 may cause, at 260, a third logical page to be retired in response to the third uncorrectable read error. In some examples, the third logical page is the LP 142 for the physical memory page 144. In this case, no command or instruction to skip programming of a dummy page for the retired third logical page is sent from the controller 124 for the LP 142 because leaving the wordline entirely erased could potentially degrade data integrity on higher wordlines in the same block. Instead, a dummy page 146 may be executed with dummy data in future P/E cycles for the retired third logical page (e.g., LP 142) and data written to memory, as shown at 265. In some examples, the dummy data represents a structurally similar but obscured version of original data, which may be used for development and testing environments.

Figure 3:
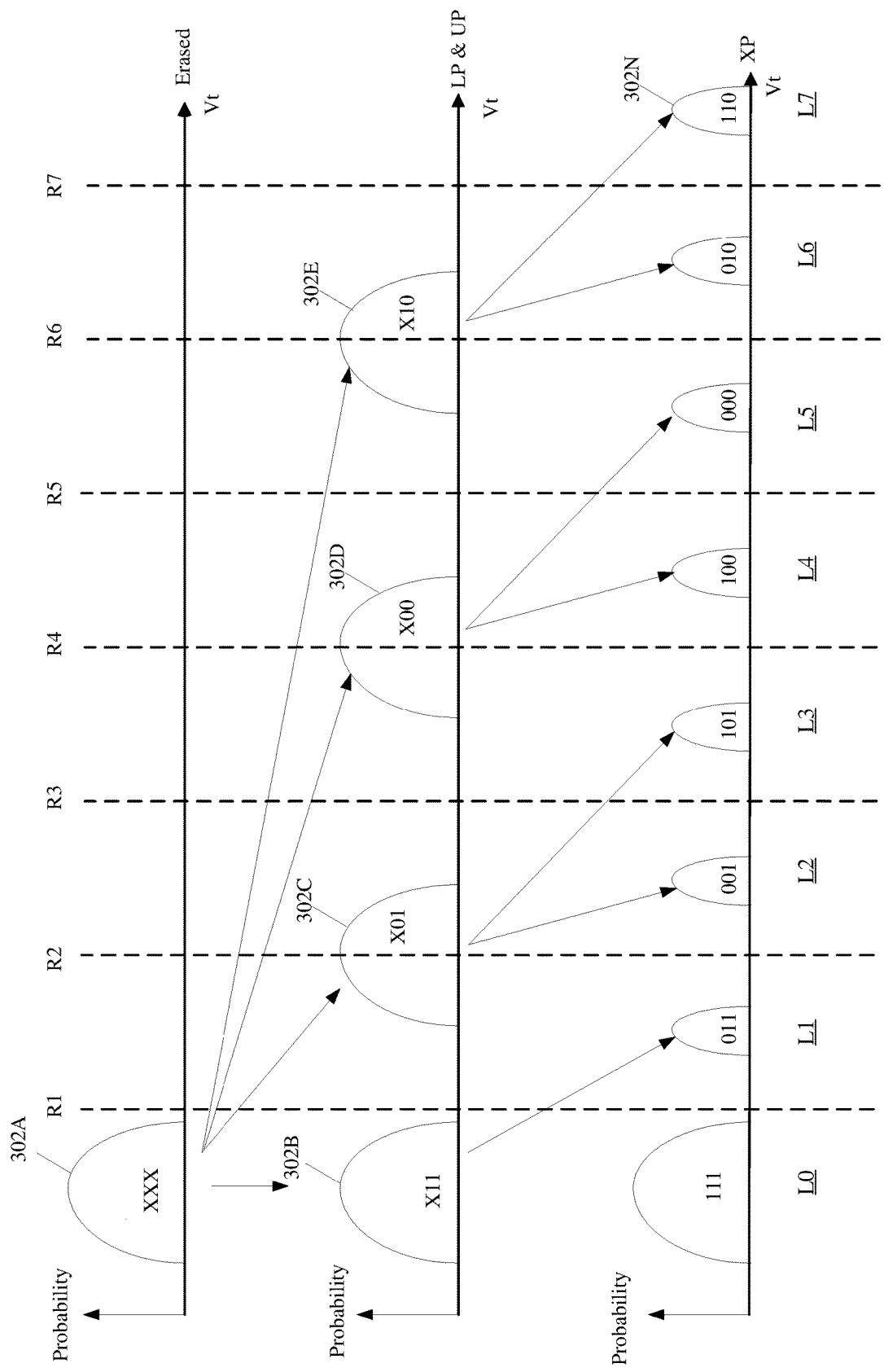
FIG. 3 illustrates an example first diagram.
Figure 4:
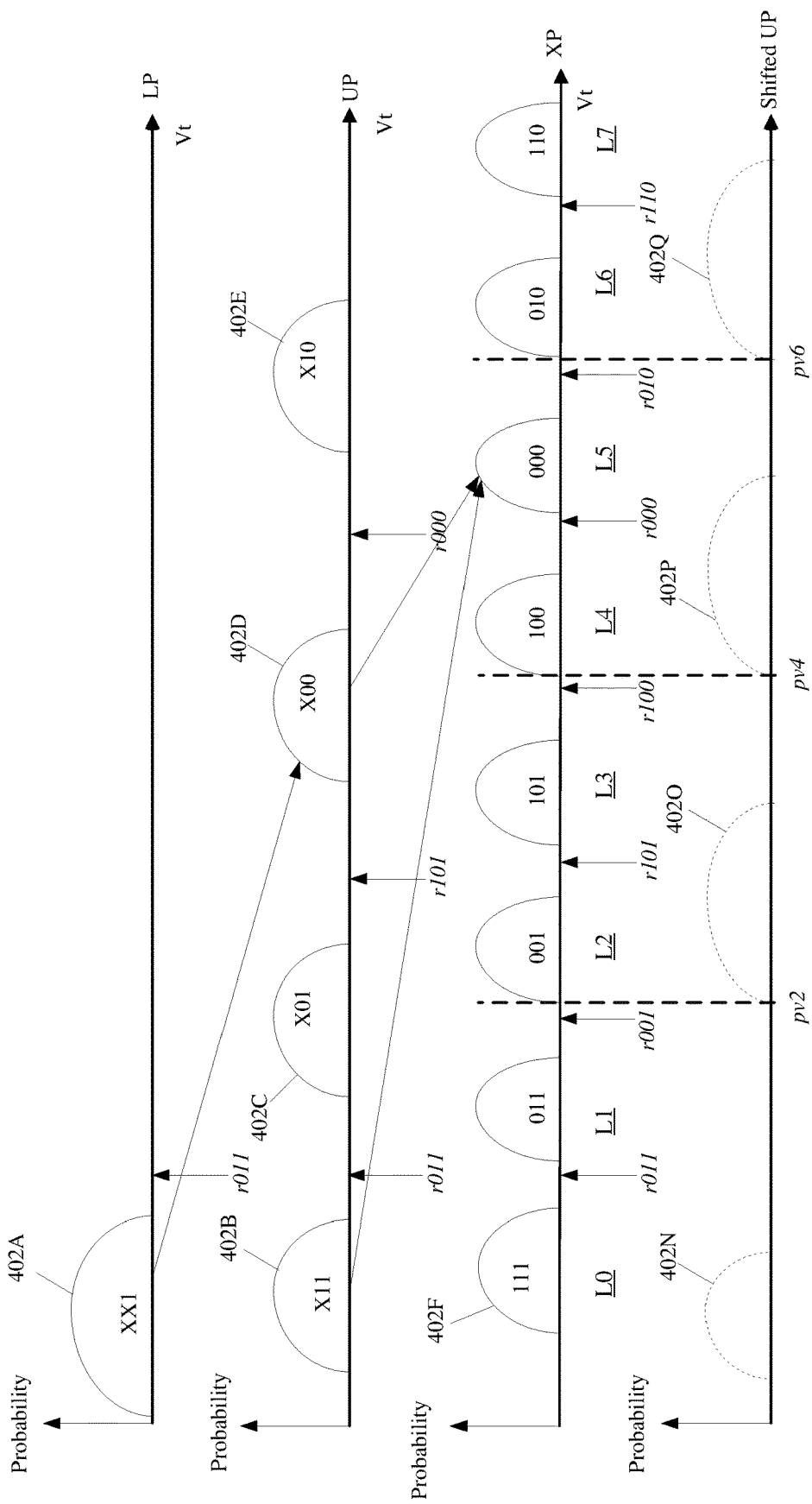
FIG. 4 illustrates an example second diagram.
Figure 5:
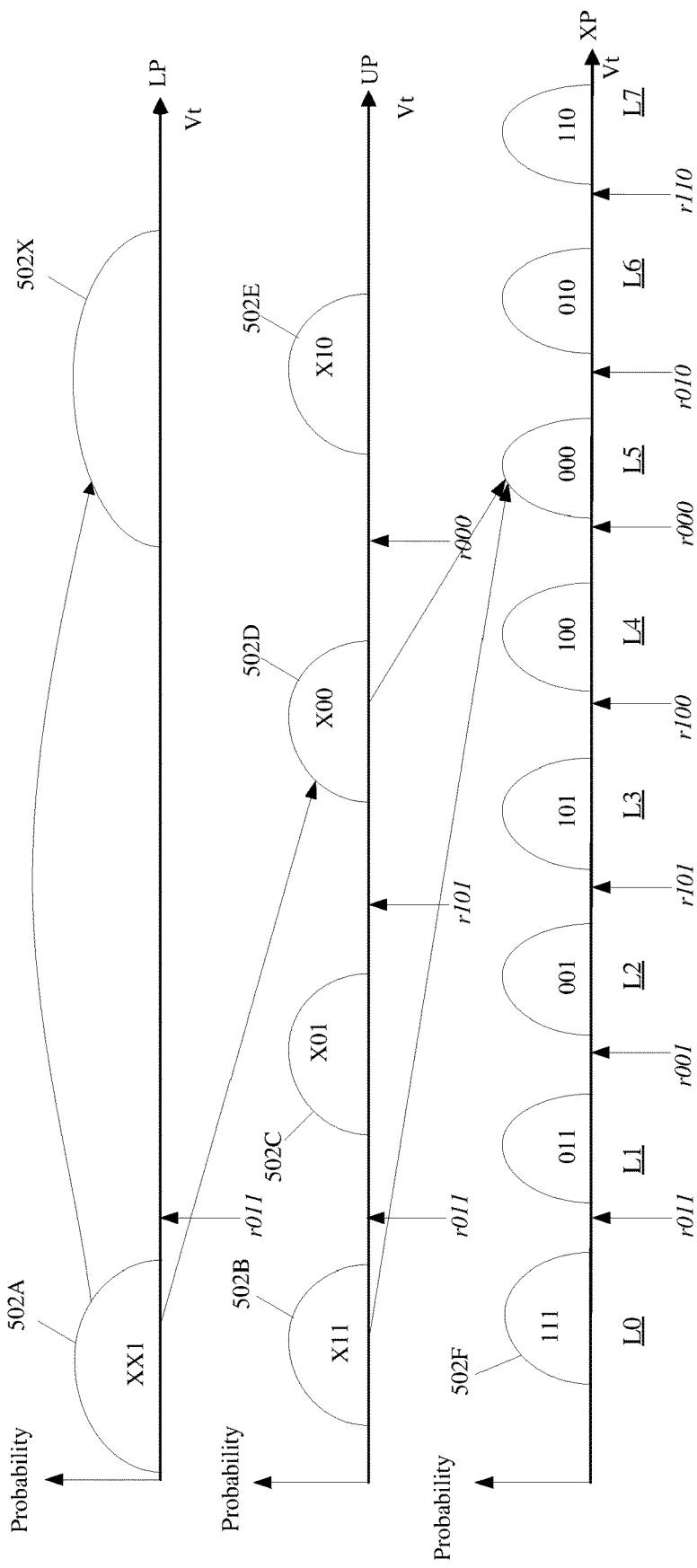
FIG. 5 illustrates an example third diagram.

FIGS. 3-5 illustrate diagrams of voltage versus probability, as well as read requests (e.g., R1-R7) and page orders for XP 140, UP 141, LP 142, and erased pages. As illustrated, an exemplary NVM cell included in the specified NVM storage location can, for example, be an TLC NAND cell with three bits per cell, which can be decoded to a 3-bit value represented by one of a plurality of states, such as state 1 (XXX), state 2 (X11), state 3 (X01), state 4 (X00), etc. Specifically, the states 1-N are illustrated with reference to curves 302A-N, respectively, which represent the mathematical probabilities (vertical axis) that the voltage along the horizontal axis corresponds to the various bit combinations (e.g., XXX, X11, X01, X00) that give rise to the respective states 1-N. Using the mathematical probabilities represented by the curves 302A-N of FIG. 3, a bit read from the NVM cell can be decoded to correspond to a 3-bit value represented by one of the states 1-N.

When the NVM read logic 127 (FIG. 1) is to be used to perform a bit read from the exemplary NVM cell, reference threshold voltage levels L0-L7 can be established between adjacent ones of the states 1-N. In this example, the NVM read logic 127 performs a bit read of a desired code word from a selected NVM device, such as storage memory device(s) 122. To that end, a multiplexor (not shown) may receive data corresponding to the code word from at least one NVM storage location of the selected storage memory device(s) 122, and provides the received data to the controller 124, which uses the data to compare a threshold voltage level of at least one NVM cell included in the NVM storage location to one or more reference threshold voltage levels (e.g., L0-L7) to determine the state (e.g., states 1-N) of the NVM cell.

In the example demonstrated in FIG. 3, XP is retired and LP/UP are still in service. LP/UP may be programmed with shifted up program verify voltages to match the voltage levels of the TLC distribution. For example, the shirted up program verify voltage may be used to relocate page data content of XP to another physical memory page (e.g., LP/UP) or other region of nonvolatile memory, and placing the retired XP on one or more lists of pages that should not be subsequently allocated for storing data. More specifically, as shown, XP may be retired, and the voltage distribution of curve 302C is programmed to above R2, the voltage distribution of curve 302D is programmed to above R4, and the voltage distribution of curve 302E is programmed to above R6. Thus a fast read, assuming 8 level distribution L0-L7, wherein a flag check is skipped, can be conducted later, as demonstrated in FIG. 4. As used herein, the flag check is an internal operation in flash memory to indicate the program status of a physical memory page, e.g., a particular page is erased, only LP is programed, or LP/UP/XP are all programmed. Thus, appropriate read levels can be used for the read operation based on the flag check.

As shown in FIG. 4, a "shifted upper page" may be added to the XP/LP/UP/Erased pages to enable fast read to memory. In this example, once the XP is retired, when programming remaining LP/UP page, system firmware may shift the program verify voltages using a unified interface command (e.g., MLBi cmd) to move cells from an erased state to the upper shifted page distribution, as demonstrated by the voltage distributions of curves 402N-Q. For example, as shown, when XP is retired, the voltage distribution of curve 402B and 402D may be programmed to above r000. Note if the LP/UP were programmed in the conventional way, for example, using the UP distribution shown in FIG. 3, fast read could not be conducted, as the flag check is needed to guide selection of the correct read levels. Here, the XP is retired, and the active LP/UP may be programmed on-the-fly with shifted verify voltages to enable fast read. As such, the shifted upper page distribution of curves 402N-Q provides improved read margins compared to the 8 level distributions (e.g., L0-L7).

In other examples, as shown in FIG. 5, XP and UP may be retired, and LP may then be programed with the program verify voltage higher than L4 of the TLC 8 level distribution to enable fast read mode. In this case, when programming the remaining LP, the system firmware may switch the NAND mode to on-the-fly SLC, translate the LP number to SLC page number, and then shift the program verify voltage using the unified interface command (e.g., MLBi cmd) to move cells from an erased state to the voltage distribution of curve 502X. The shifted SLC distribution provides improved read margins compared to the 8-level distributions from existing page retire implementations.

In some examples, special handling may be needed when reading open band. That is, flag check is enabled for open band reading. However, for a wordline with page defects, flag check is not needed as the program verify voltages are shifted to enable the read without flag check, which is demonstrated in FIGS. 3 and 4. Thus the controller 124 may enable different read flows for wordlines with and without page defects. For example, in the case of no open band, a fast read is enabled, and flag check may be disabled, allowing default mode and requiring no special setup. In the case of an open band, it is determined if the highest order page is retired. If the highest order page is retired, then flag check is disabled for read. If the highest order page is not retired, then flag check is enabled for read through a set feature command.

Figure 6:
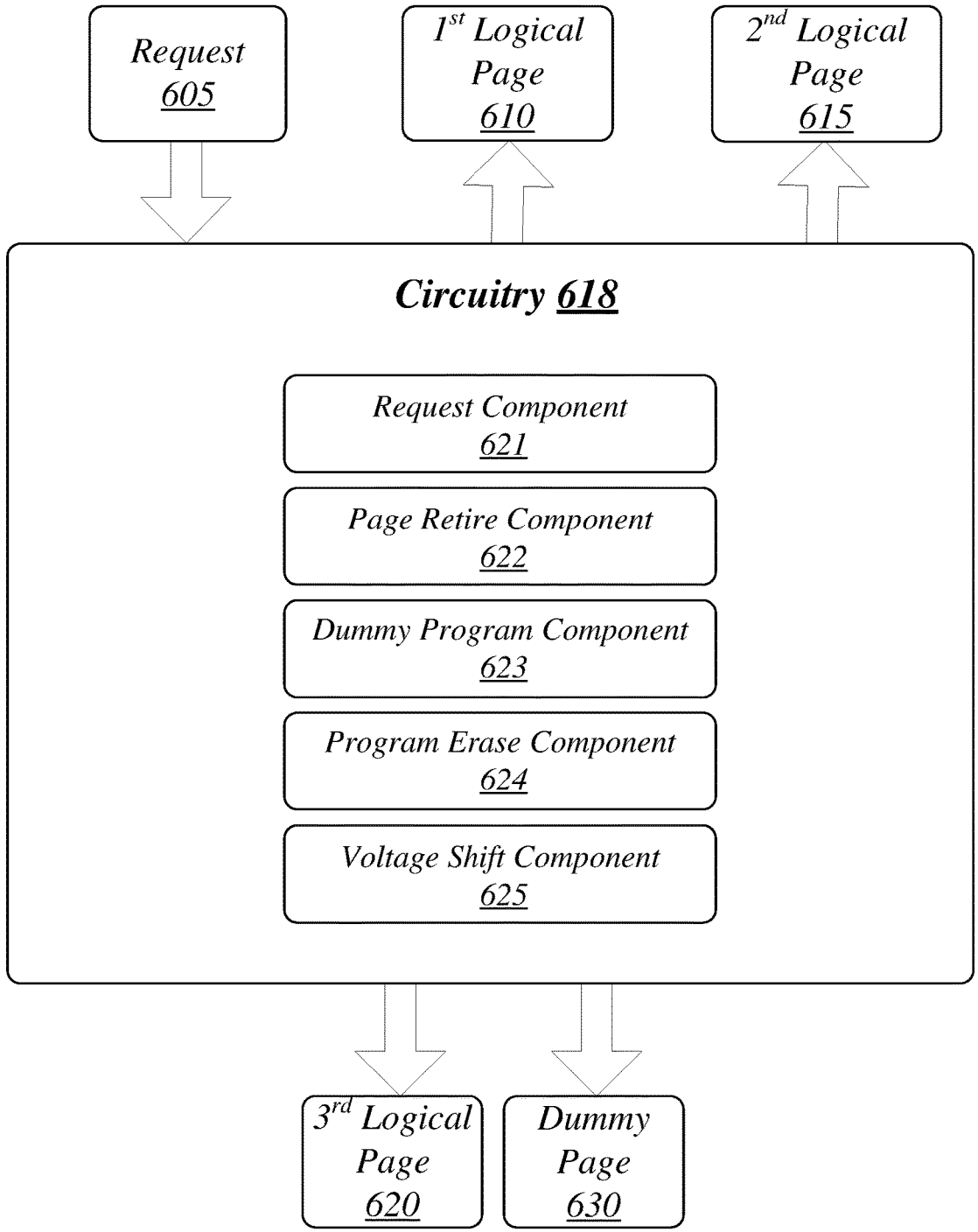
FIG. 6 illustrates an example apparatus.

FIG. 6 illustrates an example block diagram for an apparatus 600. Although apparatus 600 shown in FIG. 6 has a limited number of elements in a certain topology, it may be appreciated that the apparatus 600 may include more or less elements in alternate topologies as desired for a given implementation.

The apparatus 600 may be supported by circuitry 618, and apparatus 600 may be a controller maintained at a storage device such as controller 124 for storage system 120 of system 100 shown in FIG. 1. The storage device may be coupled to a host computing platform or device similar to host computing platform 110 also shown in FIG. 1. Also, as mentioned above, the storage device, such as storage memory device(s) 122 may include one or more memory devices or dies to store data associated with a disjointed atomic write transaction associated with a multi-block write transaction request placed by one or more applications hosted by the host computing platform. Circuitry 618 may be arranged to execute one or more software or firmware implemented modules or components, such as components 621-625. Also, these components may be software/firmware stored in computer-readable media, and although the components are shown in FIG. 6 as discrete boxes, this does not limit these components to storage in distinct computer-readable media components (e.g., a separate memory, etc.).

According to some examples, circuitry 618 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 618 may also include one or more application-specific integrated circuits (ASICs) and at least some of components 621-625 may be implemented as hardware elements of these ASICs.

According to some examples, apparatus 600 may include a request component 621. Request component 621 may be logic and/or a feature executed by circuitry 618 to receive a read request for one or more storage memory devices. For these examples, the read request to the request component 621 may be included in a request 605 and the one or more storage memory devices may be located at the storage device that includes apparatus 600. Request 605, for example, may have been sent from an application executing at a host computing device coupled with the storage device that includes apparatus 600.

In some examples, apparatus 600 may also include a page retire component 622. The page retire component 622 may be logic and/or a feature executed by circuitry 618 to retire a first logical page 610 in response to a first read error. In some examples, the first logical page is an extra page (XP) for a physical memory page of a TLC flash NAND.

In some examples, apparatus 600 includes a dummy program component 623. The dummy program component 623 may be logic and/or a feature executed by circuitry 618 to generate a signal or command to perform a dummy program sequence, which, in this case may be a sequence to skip programming of a dummy page for the retired first logical page 610. In some examples, a dummy page/dummy programming is skipped in future P/E cycles regardless of where in a physical memory page the uncorrectable read error is found.

In some examples, apparatus 600 includes a program erase component 624. The program erase component 624 may be logic and/or a feature executed by circuitry 618 to write data to memory in a subsequent P/E cycle without the dummy page being generated for the retired first logical page 610. In some examples, the retired first logical page is XP 140 of FIG. 2.

In some examples, apparatus 600 includes a voltage shift component 625. The voltage shift component 625 may be logic and/or a feature executed by circuitry 618 to program the second logical page 615 and/or the third logical page 620 with shifted program verify voltages. In some examples, once the first logical page 610 is retired, when programming remaining second and third logical pages 615, 620, system firmware may shift the program verify voltages using a unified interface command (e.g., MLBi cmd) to move cells from an erased state to the upper shifted page distribution.

In some examples, read request 605 may again be sent or submitted to the request component 621 of circuitry 618. In the event a second uncorrectable read error is found, a second logical page 615 may be retired in response to the second uncorrectable read error. In some examples, the second logical page 615 is either an upper page or a lower page, such as UP 141 or LP 142 in FIG. 2. A command to skip programming of a dummy page for the retired second logical page 615 is then sent from the dummy programming component 623. Data may then be written to memory in a subsequent P/E cycle, performed by program erase component 624, without a dummy page being generated for the retired second logical page 615.

In some examples, read request 605 may again be sent or submitted to the request component 621 of circuitry 618. In the event a third uncorrectable read error is found, in some examples, a third logical page 620 may be retired in response to the third uncorrectable read error. In some examples, the third logical page is a lower page, such as LP 142 in FIG. 2. In this case, the dummy program component 623 may generate or issue a command to program a dummy page 630 for the retired third logical page 620. In some examples, the dummy page 630 may be executed in future P/E cycles for the retired third logical page 620.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 7 illustrates an example of a logic flow 700. Logic flow 700 may be representative of some or all of the operations executed by one or more logic, features, or devices described herein, such as apparatus 600. More particularly, logic flow 700 may be implemented by one or more of components 621-625. In some examples, logic flow 700 represents logic to perform a defect management policy to the one or more NVM devices to retire the same physical memory page corresponding to first, second, and third logical pages.

According to some examples, logic flow 700 at block 702 may receive, at a controller for one or more non-volatile memory (NVM) devices, a read request. For these examples, the request component 621 may receive the read request from an application. According to some examples, logic flow 700 at block 704 may retire a first logical page for a physical memory page in response to a first read error. For these examples, the page retire component 622 may perform this operation. According to some examples, logic flow 700 at block 706 may generate a signal or command to skip programming of a dummy page for the retired first logical page. For these examples, the dummy program component 623 may perform this operation.

According to some examples, logic flow 700 at block 708 may retire a second logical page for the same physical memory page in response to a second read error, wherein the first logical page has a higher order than the second logical page in a same physical memory page. For these examples, the page retire component 622 may perform this operation. According to some examples, logic flow 700 at block 710 may generate a signal or command to skip programming of a dummy page for the retired second logical page. For these examples, the dummy program component 623 may perform this operation.

According to some examples, logic flow 700 at block 712 may retire a third logical page for the same physical memory page in response to a third read error, wherein the second logical page has a higher order than the third logical page in the same physical memory page. For these examples, the page retire component 622 may perform this operation. According to some examples, logic flow 700 at block 714 may generate a signal or command to program a dummy page for the retired third logical page. For these examples, the dummy program component 623 may perform this operation.

FIG. 8 illustrates an example of a storage medium. As shown in FIG. 8, the storage medium 800 may comprise an article of manufacture. In some examples, storage medium 800 may include any non-transitory computer readable medium or machine readable medium, such as an optical, magnetic or semiconductor storage. Storage medium 800 may store various types of computer executable instructions, such as instructions to implement logic flow 700. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 9:
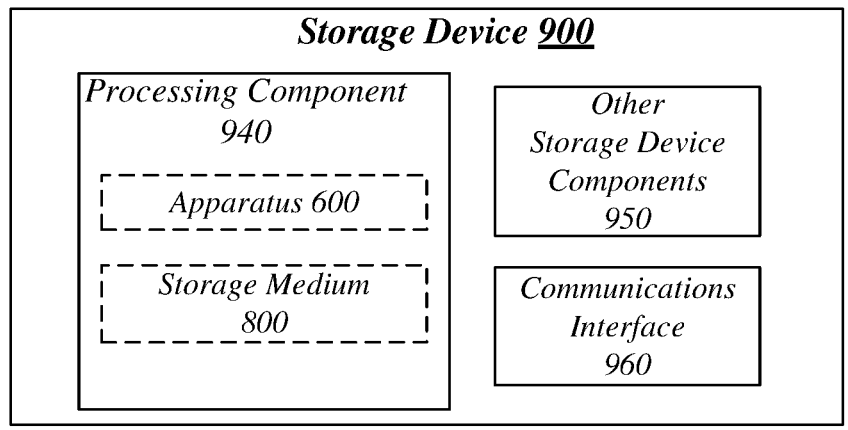
FIG. 9 illustrates an example storage device.

FIG. 9 illustrates an example storage device 900. In some examples, as shown in FIG. 9, storage device 900 may include a processing component 940, other storage device components 950 or a communications interface 960. According to some examples, storage device 900 may be capable of being coupled to a host computing device or platform.

According to some examples, processing component 940 may execute processing operations or logic for apparatus 600 and/or storage medium 800. Processing component 940 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software components, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other storage device components 950 may include common computing elements or circuitry, such as one or more processors, multi-core processors, co-processors, memory units, chipsets, controllers, interfaces, oscillators, timing devices, power supplies, and so forth. Examples of memory units may include without limitation various types of computer readable and/or machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristers, STT-MRAM, magnetic or optical cards, and any other type of storage media suitable for storing information.

In some examples, communications interface 960 may include logic and/or features to support a communication interface. For these examples, communications interface 960 may include one or more communication interfaces that operate according to various communication protocols or standards to communicate over direct or network communication links. Direct communications may occur via use of communication protocols such as SMBus, PCIe, NVMe, quick path interconnect (QPI), SATA, SAS or universal serial bus (USB) communication protocols. Network communications may occur via use of communication protocols Ethernet, Infiniband, SATA or SAS communication protocols.

Storage device 900 may be arranged as an SSD or an HDD that may be configured as described above for storage system 120 of system 100 as shown in FIG. 1. Accordingly, functions and/or specific configurations of storage device 900 described herein, may be included or omitted in various embodiments of storage device 900, as suitably desired.

The components and features of storage device 900 may be implemented using any combination of discrete circuitry, ASICs, logic gates and/or single chip architectures. Further, the features of storage device 900 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the example storage device 900 shown in the block diagram of FIG. 9 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

Figure 10:
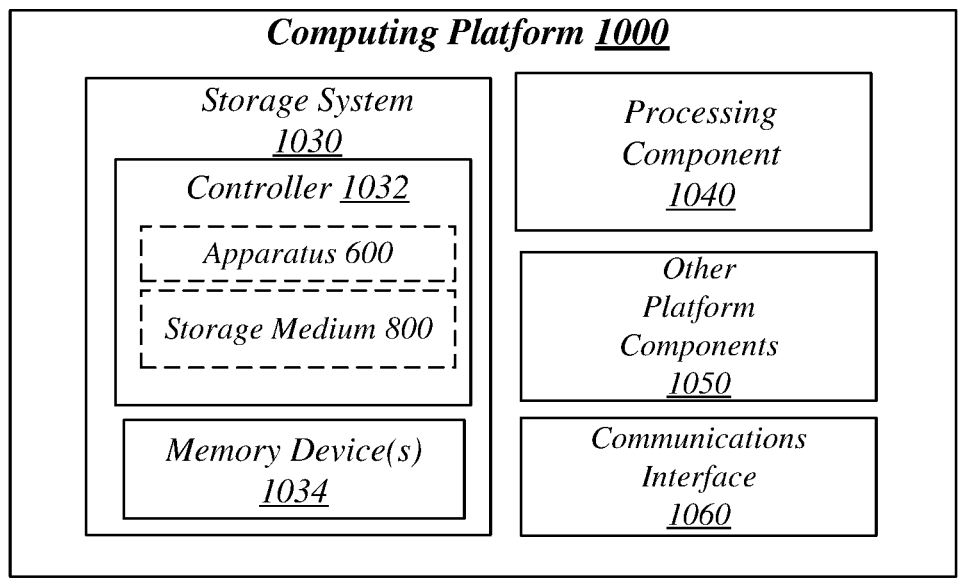
FIG. 10 illustrates an example computing platform.

FIG. 10 illustrates an example computing platform 1000. In some examples, as shown in FIG. 10, computing platform 1000 may include a storage system 1030, a processing component 1040, other platform components 1050 or a communications interface 1060. According to some examples, computing platform 1000 may be implemented in a computing device.

According to some examples, storage system 1030 may be similar to storage system 120 of system 100 as shown in FIG. 1 and includes a controller 1032 and memory devices(s) 1034. For these examples, logic and/or features resident at or located at controller 1032 may execute at least some processing operations or logic for apparatus 600 and may include storage media that includes storage medium 800. Also, memory device(s) 1034 may include similar types of volatile or non-volatile memory (not shown) that are described above for storage system 120 shown in FIG. 1.

According to some examples, processing component 1040 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, PLD, DSP, FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1050 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 850 or storage system 830 may include without limitation, various types of computer readable and machine readable storage media in the form of one or more higher speed memory units, such as ROM, RAM, DRAM, DDRAM, SDRAM, SRAM, PROM, EPROM, EEPROM, flash memory, ferroelectric memory, SONOS memory, polymer memory such as ferroelectric polymer memory, nanowire, FeTRAM or FeRAM, ovonic memory, nanowire, EEPROM, phase change memory, memristers, STT-MRAM, magnetic or optical cards, an array of devices such as RAID drives, solid state memory devices, SSDs, HDDs or any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 1000 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1000 described herein, may be included or omitted in various embodiments of computing platform 1000, as suitably desired.

The components and features of computing platform 1000 may be implemented using any combination of discrete circuitry, ASICs, logic gates and/or single chip architectures. Further, the features of computing platform 1000 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An exemplary apparatus may include one or more non-volatile memory (NVM) devices, a storage controller that includes logic, at least a portion of which is in hardware, the logic to retire a first logical page in response to a first read error, preclude a dummy page from being generated for the retired first logical page, write data to the one or more NVM devices in a program-erase (P/E) cycle, and retire a second logical page in response to a second read error, wherein the first logical page has a higher order than the second logical page in a same physical memory page.

Example 2

The apparatus of example 1, further including the logic to preclude a dummy page from being generated for the retired second logical page, write data to the one or more NVM devices in a second P/E cycle.

Example 3

The apparatus of example 2, further including the logic to retire a third logical page in response to a third read error, program a dummy page for the third retired page, and write data to the one or more NVM devices in a third P/E cycle following programming of the dummy page for the third retired page.

Example 4

The apparatus of example 3, the first, second, and third logical pages located in the same physical memory page.

Example 5

The apparatus of example 3, the second logical page having a higher order than the third logical page for the same physical memory page.

Example 6

The apparatus of example 3, further including the logic to program the second logical page with shifted program verify voltages.

Example 7

The apparatus of example 3, further including the logic to program the third logical page with shifted program verify voltages.

Example 8

The apparatus of example 1, further including the logic to program a dummy page for the second retired page, and write data to the one or more NVM devices in a second P/E cycle following programming of the dummy page for the third retired page.

Example 9

The apparatus of example 1, the first logical page being an extra page, and the second logical page being an upper page or a lower page.

Example 10

The apparatus of example 1, the one or more NVM devices comprises one or more types of non-volatile memory to include 3-dimensional cross-point memory, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

Example 11

An exemplary method may include receiving, at a controller for one or more non-volatile memory (NVM) devices, a read request, retiring a first logical page in response to a first read error, precluding a dummy page from being generated for the retired first logical page, writing data to the one or more NVM devices in a program-erase (P/E) cycle, and retiring a second logical page in response to a second read error, wherein the first logical page has a higher order than the second logical page in a same physical memory page.

Example 12

The method of example 11, further including precluding a dummy page from being generated for the retired second logical page, and writing data to the one or more NVM devices in a second P/E cycle.

Example 13

The method of example 12, further including retiring a third logical page in response to a third read error, programming a dummy page for the third retired page, and writing data to the one or more NVM devices in a third P/E cycle following programming of the dummy page for the third retired page.

Example 14

The method of example 13, further including programming the third logical page with shifted program verify voltages.

Example 15

The method of example 11, further including programming the second logical page with shifted program verify voltages.

Example 16

At least one machine readable medium may include a plurality of instructions that in response to being executed by a system cause the system to carry out a method according to any one of examples 11 to 15.

Example 17

An apparatus may include means for performing the methods of any one of examples 11 to 15.

Example 18

An exemplary system may include a storage system including one or more non-volatile memory (NVM) devices, a storage controller that includes logic, at least a portion of which is in hardware, the logic to retire a first logical page in response to a first read error, preclude a dummy page from being generated for the retired first logical page, write data to the one or more NVM devices in a program-erase (P/E) cycle, and retire a second logical page in response to a second read error, wherein the first logical page has a higher order than the second logical page in a same physical memory page.

Example 19

The system of example 18, further including the logic to preclude a dummy page from being generated for the retired second logical page, and write data to the one or more NVM devices in a second P/E cycle.

Example 20

The system of example 19, further including the logic to retire a third logical page in response to a third read error, program a dummy page for the third retired page, and write data to the one or more NVM devices in a third P/E cycle following programming of the dummy page for the third retired page.

Example 21

The system of example 20, the first, second, and third logical pages being located in the same physical memory page.

Example 22

The system of example 20, the second logical page having a higher order than the third logical page for the same physical memory page.

Example 23

The system of example 20, further including the logic to program the second logical page and the third logical page with shifted program verify voltages.

Example 24

The system of example 18, further including a processor for a host computing device to execute one or more applications.

Example 25

The system of example 18, further including the logic to execute a defect management scheme for the one or more NVM devices to retire the same physical memory page corresponding to the first and second logical pages.

Example 26

The system of example 18, the first logical page being an extra page, and the second logical page being an upper page or a lower page.

Example 27

The system of example 18, the one or more NVM devices comprising one or more types of non-volatile memory to include 3-dimensional cross-point memory, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

Example 28

At least one non-transitory computer-readable storage medium for NAND flash page retirement, the at least one non-transitory computer-readable storage medium may include a set of instructions that, in response to being executed on a processing component at a computing platform, cause the processing component to retire a first logical page in response to a first read error, preclude a dummy page from being generated for the retired first logical page, write data to the one or more NVM devices in a program-erase (P/E) cycle, and retire a second logical page in response to a second read error, wherein the first logical page has a higher order than the second logical page in a same physical memory page.

Example 29

The at least one non-transitory computer-readable storage medium of example 28, further including a set of instructions that, in response to being executed on a processing component at a computing platform, cause the processing component to preclude a dummy page from being generated for the retired second logical page, and write data to the one or more NVM devices in a second P/E cycle.

Example 30

The at least one non-transitory computer-readable storage medium of example 29, further comprising a set of instructions that, in response to being executed on a processing component at a computing platform, cause the processing component to retire a third logical page in response to a third read error, program a dummy page for the third retired page, and write data to the one or more NVM devices in a third P/E cycle following programming of the dummy page for the third retired page.

Example 31

The at least one non-transitory computer-readable storage medium of example 30, the first, second, and third logical pages being located in the same physical memory page.

Example 32

The at least one non-transitory computer-readable storage medium of example 30, the second logical page having a higher order than the third logical page for the same physical memory page.

Example 33

The at least one non-transitory computer-readable storage medium of example 30, further including a set of instructions that, in response to being executed on a processing component at a computing platform, cause the processing component to program the second logical page with shifted program verify voltages.

Example 34

The at least one non-transitory computer-readable storage medium of example 30, further including a set of instructions that, in response to being executed on a processing component at a computing platform, cause the processing component to program the third logical page with shifted program verify voltages.

Example 35

The at least one non-transitory computer-readable storage medium of example 28, further including a set of instructions that, in response to being executed on a processing component at a computing platform, cause the processing component to execute a defect management scheme for the one or more NVM devices to retire the same physical memory page corresponding to the first and second logical pages.

Example 36

The at least one non-transitory computer-readable storage medium of example 28, the first logical page being an extra page, and the second logical page being an upper page or a lower page.

Example 37

The at least one non-transitory computer-readable storage medium of example 28, the one or more NVM devices comprises one or more types of non-volatile memory to include 3-dimensional cross-point memory, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

Example 38

An exemplary NAND flash page retirement method may include receiving, at a controller for one or more non-volatile memory (NVM) devices, a read request, retiring a first logical page in response to a first read error, precluding a dummy page from being generated for the retired first logical page, writing data to the one or more NVM devices in a program-erase (P/E) cycle, and retiring a second logical page in response to a second read error, wherein the first logical page has a higher order than the second logical page in a same physical memory page.

Example 39

The NAND flash page retirement method of example 38, further including precluding a dummy page from being generated for the retired second logical page, and writing data to the one or more NVM devices in a second P/E cycle.

Example 40

The NAND flash page retirement method of example 39, further including retiring a third logical page in response to a third read error, programming a dummy page for the third retired page, and writing data to the one or more NVM devices in a third P/E cycle following programming of the dummy page for the third retired page.

Example 41

The NAND flash page retirement method of example 42, further including programming the third logical page with shifted program verify voltages.

Example 42

The NAND flash page retirement method of example 38, further including programming the second logical page with shifted program verify voltages.

Example 43

At least one machine readable medium including a plurality of instructions that in response to being executed by a system cause the system to carry out a method according to any one of examples 38 to 42.

Example 44

An apparatus including means for performing the methods of any one of examples 38 to 42.

Example 45

At least one machine readable medium for NAND flash page retirement, the at least one machine readable medium including a plurality of instructions that in response to being executed by a processor on a computing platform, cause the processor to retire a first logical page in response to a first read error, preclude a dummy page from being generated for the retired first logical page, write data to the one or more NVM devices in a program-erase (P/E) cycle, and retire a second logical page in response to a second read error, wherein the first logical page has a higher order than the second logical page in a same physical memory page.

Example 46

The at least one machine readable medium for NAND flash page retirement of example 45, the at least one machine readable medium including a plurality of instructions that in response to being executed by a processor on a computing platform, cause the processor to preclude a dummy page from being generated for the retired second logical page, and write data to the one or more NVM devices in a second P/E cycle.

Example 47

The at least one machine readable medium for NAND flash page retirement of example 46, the at least one machine readable medium including a plurality of instructions that in response to being executed by a processor on a computing platform, cause the processor to retire a third logical page in response to a third read error, program a dummy page for the third retired page, and write data to the one or more NVM devices in a third P/E cycle following programming of the dummy page for the third retired page.

Example 48

The at least one machine readable medium for NAND flash page retirement of example 47, the first, second, and third logical pages being located in the same physical memory page.

Example 49

The at least one machine readable medium for NAND flash page retirement of example 47, the second logical page having a higher order than the third logical page for the same physical memory page.

Example 50

The at least one machine readable medium for NAND flash page retirement of example 47, the at least one machine readable medium comprising a plurality of instructions that in response to being executed by a processor on a computing platform, cause the processor to program the second logical page with shifted program verify voltages.

Example 51

The at least one machine readable medium for NAND flash page retirement of example 47, the at least one machine readable medium including a plurality of instructions that in response to being executed by a processor on a computing platform, cause the processor to program the third logical page with shifted program verify voltages.

Example 52

The at least one machine readable medium for NAND flash page retirement of example 45, the at least one machine readable medium including a plurality of instructions that in response to being executed by a processor on a computing platform, cause the processor to execute a defect management scheme for the one or more NVM devices to retire the same physical memory page corresponding to the first and second logical pages.

Example 53

The at least one machine readable medium for NAND flash page retirement of example 45, the first logical page being an extra page, and the second logical page being an upper page or a lower page.

Example 54

The at least one machine readable medium for NAND flash page retirement of example 45, the one or more NVM devices comprises one or more types of non-volatile memory to include 3-dimensional cross-point memory, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

Example 55

An exemplary system may include a host computing platform, a storage system operably coupled with the host computing platform, the storage system including a defect management policy engine communicably coupled to a controller for causing the controller to retire a first logical page in response to a first read error, preclude a dummy page from being generated for the retired first logical page, write data to the one or more NVM devices in a program-erase (P/E) cycle, retire a second logical page in response to a second read error, wherein the first logical page has a higher order than the second logical page in a same physical memory page.

Example 56

The system of example 55, the defect management policy engine further causing the controller to preclude a dummy page from being generated for the retired second logical page, and program the one or more NVM devices in a second P/E cycle.

Example 57

The system of example 56, the defect management policy engine further causing the controller to retire a third logical page in response to a third read error, program a dummy page for the third retired page, and write data to the one or more NVM devices in a third P/E cycle following programming of the dummy page for the third retired page.

Example 58

The system of example 57, the first, second, and third logical pages located in the same physical memory page.

Example 59

The system of example 57, the second logical page having a higher order than the third logical page for the same physical memory page.

Example 60

The system of example 57, the defect management policy engine further causing the controller to program the second logical page with shifted program verify voltages.

Example 61

The system of example 57, the defect management policy engine further causing the controller to program the third logical page with shifted program verify voltages.

Example 62

The system of example 55, the defect management policy engine further causing the controller to execute a defect management scheme for the one or more NVM devices to retire the same physical memory page corresponding to the first and second logical pages.

Example 63

The system of example 55, the first logical page being an extra page, and the second logical page being an upper page or a lower page.

Example 64

The system of example 55, the one or more NVM devices includes one or more types of non-volatile memory to include 3-dimensional cross-point memory, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

Example 65

The system of example 55, further including one or more of: one or more processors communicatively coupled to the controller, a network interface communicatively coupled to the system, a battery coupled to the system, or a display communicatively coupled to the system.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first, " "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
    one or more non-volatile memory (NVM) devices, the one or more NVM devices to comprise triple level cell (TLC) NVM devices; and
    a storage controller that includes logic, at least a portion of which is in hardware, the logic configured to:
    retire a first logical page in response to a first read error;
    preclude a dummy page from being generated for the retired first logical page;
    write data to the one or more NVM devices in a program-erase (P/E) cycle;
    retire a second logical page in response to a second read error, wherein the first logical page has a higher order than the second logical page in a same physical memory page;
    preclude a dummy page from being generated for the retired second logical page;
    write data to the one or more NVM devices in a second P/E cycle;
    retire a third logical page in response to a third read error;
    program a dummy page for the retired third logical page; and
    write data to the one or more NVM devices in a third P/E cycle following programming of the dummy page for the retired third logical page.

2. The apparatus of claim 1, the first, second, and third logical pages located in the same physical memory page.

3. The apparatus of claim 1, the second logical page having a higher order than the third logical page for the same physical memory page.

4. The apparatus of claim 1, wherein the logic is further configured to program the second logical page with shifted program verify voltages.

5. The apparatus of claim 1, wherein the logic is further configured to program the third logical page with shifted program verify voltages.

6. The apparatus of claim 1, wherein the logic is further configured to:
   program a dummy page for the retired second logical page; and
   write data to the one or more NVM devices in a second P/E cycle following programming of the dummy page for the retired second logical page.

7. The apparatus of claim 1, the first logical page being an extra page, and the second logical page being an upper page or a lower page.

8. The apparatus of claim 1, the one or more NVM devices comprises one or more types of non-volatile memory to include 3-dimensional cross-point memory, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

9. A method comprising:
   receiving, at a controller for one or more non-volatile memory (NVM) devices, a read request, the NVM devices comprising triple level cell (TLC) devices;
   retiring a first logical page in response to a first read error;
   precluding a dummy page from being generated for the retired first logical page; writing data to the one or more NVM devices in a program-erase (P/E) cycle; and
   retiring a second logical page in response to a second read error, wherein the first logical page has a higher order than the second logical page in a same physical memory page;
   precluding a dummy page from being generated for the retired second logical page;
   writing data to the one or more NVM devices in a second P/E cycle;
   retiring a third logical page in response to a third read error; programming a dummy page for the retired third logical page; and
   writing data to the one or more NVM devices in a third P/E cycle following programming of the dummy page for the retired third logical page.

10. The method of claim 9, further comprising programming the third logical page with shifted program verify voltages.

11. The method of claim 9, further comprising programming the second logical page with shifted program verify voltages.

12. A system comprising:
   a storage system including:
      one or more non-volatile memory (NVM) devices, the one or more NVM devices to comprise triple level cell (TLC) NVM devices; and
      a storage controller that includes logic, at least a portion of which is in hardware, the logic configured to:
         retire a first logical page in response to a first read error;
         preclude a dummy page from being generated for the retired first logical page;
         write data to the one or more NVM devices in a program-erase (P/E) cycle;
         retire a second logical page in response to a second read error, wherein the first logical page has a higher order than the second logical page in a same physical memory page;
         preclude a dummy page from being generated for the retired second logical page;
         write data to the one or more NVM devices in a second P/E cycle;
         retire a third logical page in response to a third read error;
   program a dummy page for the retired third logical page; and
   write data to the one or more NVM devices in a third P/E cycle following programming of the dummy page for the retired third logical page.

13. The system of claim 12, the first, second, and third logical pages being located in the same physical memory page.

14. The system of claim 12, the second logical page having a higher order than the third logical page for the same physical memory page.

15. The system of claim 12, wherein the logic is further configured to program the second logical page and the third logical page with shifted program verify voltages.

16. The system of claim 12, further comprising a processor for a host computing device to execute one or more applications.

17. The system of claim 12, wherein the logic is further configured to perform a defect management policy to the one or more NVM devices to retire the same physical memory page corresponding to the first and second logical pages.

18. The system of claim 12, the first logical page being an extra page, and the second logical page being an upper page or a lower page.

19. The system of claim 12, the one or more NVM devices comprising one or more types of non-volatile memory to include 3-dimensional cross-point memory, flash memory, ferroelectric memory, silicon-oxide-nitride-oxide-silicon (SONOS) memory, polymer memory, ferroelectric polymer memory, ferroelectric transistor random access memory (FeTRAM or FeRAM), ovonic memory, nanowire, electrically erasable programmable read-only memory (EEPROM), phase change memory, memristors or spin transfer torque-magnetoresistive random access memory (STT-MRAM).

20. The system of claim 12, comprising one or more of:
   one or more processors communicatively coupled to the storage controller; a network interface communicatively coupled to the system;
   a battery coupled to the system; or
   a display communicatively coupled to the system.

* * * * *